(12) United States Patent
Alshareef et al.

(10) Patent No.: US 7,582,521 B2
(45) Date of Patent: Sep. 1, 2009

(54) DUAL METAL GATES FOR MUGFET DEVICE

(75) Inventors: Husam Niman Alshareef, Austin, TX (US); Weize Xiong, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 248 days.

(21) Appl. No.: 11/744,322

(22) Filed: May 4, 2007

(65) Prior Publication Data
US 2008/0272433 A1 Nov. 6, 2008

(51) Int. Cl.
*H01L 21/8238* (2006.01)
(52) U.S. Cl. ............... 438/199; 438/588; 257/E21.632
(58) Field of Classification Search ............ 438/199, 438/301, 303, 588, 652; 257/E21.632
See application file for complete search history.

(56) References Cited

U.S. PATENT DOCUMENTS 6,972,224 B2 * 12/2005 Gilmer et al. ............... 438/199

* cited by examiner

*Primary Examiner*—Hoai v Pham
(74) *Attorney, Agent, or Firm*—Warren L. Franz; Wade J. Brady, III; Frederick J. Telecky, Jr.

(57) ABSTRACT

Exemplary embodiments provide methods and structures for controlling work function values of dual metal gate electrodes for transistor devices. Specifically, the work function value of one of the PMOS and NMOS metal gate electrodes can be controlled by a reaction between stacked layers deposited on a gate dielectric material. The stacked layers can include a first-metal-containing material such as $Al_2O_3$, and/or AlN overlaid by a second-metal-containing material such as TaN, TiN, WN, MoN or their respective metals. The reaction between the stacked layers can create a metal gate material with a desired work function value ranging from about 4.35 eV to about 5.0 eV. The disclosed methods and structures can be used for CMOS transistors including MOSFET devices formed on a bulk substrate, and planar FET devices or 3-D MuGFET devices (e.g., FinFET devices) formed upon the oxide insulator of a SOI.

18 Claims, 3 Drawing Sheets

DUAL METAL GATES FOR MUGFET DEVICE

DESCRIPTION OF THE INVENTION

1. Field of the Invention

This invention relates generally to semiconductor devices and fabrication processes and, more particularly, to complementary transistors having dual work function metal gate electrodes and methods for their fabrication.

2. Background of the Invention

Electrical active devices such as complementary transistors require low threshold voltages ($V_t$) for high device performance. Generally, metal gate electrodes are used to reduce gate depletion and meet the high performance goals. A conventional solution to obtain low $V_t$ is to use dual work function metal gate electrodes. Problems arise, however, because integration of dual work function metal gate electrodes has proven to be a difficult task. For example, one difficult aspect of dual work function metal gate integration is control of the work function value, especially for three dimensional transistor devices, which requires a work function value around mid gap by about 200 mV.

Thus, there is a need to overcome these and other problems of the prior art and to provide methods and structures to precisely control the work function value of metal gate electrodes.

SUMMARY OF THE INVENTION

According to various embodiments, the present teachings include a method for forming a transistor device. In this method, a gate dielectric can be formed over a semiconductor substrate, and a first-metal-containing material can be formed on a first selected surface of the gate dielectric. Thereafter, a second-metal-containing layer can be deposited on each surface of the first-metal-containing material and a second selected surface of the gate dielectric. By reacting the first-metal-containing material with an overlaid portion of the second-metal-containing layer, a first gate material can be formed. The portion of the second-metal-containing layer on the second selected surface of the gate dielectric can be a second gate material.

According to various embodiments, the present teachings also include a transistor device. The transistor device can include a dielectric material disposed over a semiconductor substrate, and a first metal gate electrode disposed on the dielectric material. The first metal gate electrode can be formed by reacting a first-metal-containing material on the dielectric material with a second-metal-containing material on the first-metal-containing material. A second metal gate electrode can be formed from the second-metal-containing material on the dielectric material.

According to various embodiments, the present teachings further include a transistor device. The transistor device can include a dielectric material disposed on and surrounding a fin structure. The fin structure can be formed from an exposed silicon block of a SOI substrate. The transistor device can also include a first metal gate electrode disposed on and surrounding the dielectric material by reacting an Al-containing material on the dielectric material with a metal nitride on the Al-containing material. The transistor device can further include a second metal gate electrode disposed on and surrounding the dielectric material. The second metal gate electrode can include the metal nitride.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
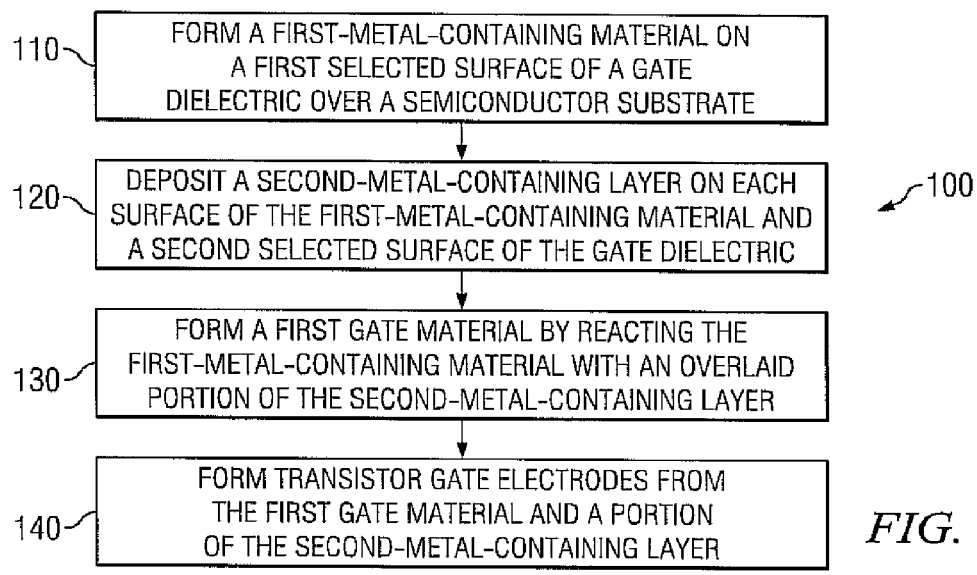
FIG. 1 depicts an exemplary method for fabricating a dual work function metal gated transistor device in accordance with the present teachings.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Exemplary embodiments provide methods and structures for controlling work function values of dual metal gate electrodes for transistor devices. Specifically, the work function value of one of the PMOS and NMOS metal gate electrodes can be controlled by a selective reaction between stacked layers deposited on a gate dielectric material. The stacked layers can include a first-metal-containing material such as $Al_2O_3$, and/or AlN overlaid by a second-metal-containing material such as TaN, TiN, WN, MoN or their respective metals. The selective reaction between the stacked layers can create a metal gate material with a desired work function value ranging from about 4.35 eV to about 5.0 eV. The disclosed methods and structures can be used for CMOS transistors including MOSFET devices formed on a bulk substrate, and planar FET (i.e., field effect transistor) devices or three dimensional MuGFET (i.e., multi-gate field effect transistor) devices such as a FinFET (i.e., fin-like field effect transistor) formed upon the dielectric (e.g., oxide insulator) of a SOI (i.e., silicon-on-insulator) substrate.

In various embodiments, each metal gate electrode can include one or more conductive materials, from which a competent metal gate electrode can be formed. The metal gate electrode can include various metal-containing materials, for example, single metals such as, Al, Ti, Ta, W, Mo, Zr, or Hf; metal alloys such as Ti—Ta, Ti—W, Ti—Mo, Ti—Zr, or Ti—Hf; metal nitrides such as TiN, TaN, WN, MoN, ZrN, or HfN; metal silicides such as $TiSi_2$, $TaSi_{27}$ or $WSi_2$, metal-Al-nitrides such as TiAlN, TaAlN, WAlN, ZrAlN, or MoAlN; metal silicon nitrides such as TiSiN, TaSiN, WSiN, HfSiN, ZrSiN, or MoSiN, and all possible combinations thereof.

The gate dielectric material can include one or more materials selected from the group consisting of silicon oxide ($SiO_2$), silicon nitride ($Si_3N_4$), silicon oxynitride (SiON), hafnium oxide ($HfO_2$), hafnium-silicate (HfSiO), nitrided hafnium-silicate (HfSiON), zirconium oxide ($ZrO_2$), aluminum oxide ($Al_2O_3$), zirconium silicate ($ZrSiO_4$), zirconium silicon oxynitride (ZrSiON), hafnium lanthanum oxynitride (HfLaON), hafnium aluminum oxynitride (HfAlON), and tantalum oxide ($Ta2O_5$).

In various embodiments, the gate dielectric material can include a material with desired dielectric constant in order to tailor the transistor device with a specific application. For example, high-k dielectric can be used as a FinFET NMOS gate dielectric. Exemplary high-k dielectric materials can include, but are not limited to, SiON, $Si_3N_4$, $HfO_2$, HfSiO, HfSiON, $Al_2O_3$, $ZrO_2$, $ZrSiO_2$, and $Ta2O_5$. In various embodiments, the gate dielectric material can be formed by growing or depositing dielectric materials on a semiconductor substrate such as a bulk silicon or a SOI wafer. The gate dielectric material can be formed using various technques, such as, for example, chemical vapor deposition (CVD), atomic layer deposition (ALD), physical vapor deposition (PVD), molecular beam epitaxy (MBE), and other variants of these processes.

In various embodiments, the disclosed dual work function gated devices can be formed having a first work function value for a PMOS gate electrode for example, and a second work function value for an NMOS gate electrode, wherein the first work function value is greater than the second work function value. In various embodiments, an NMOS gate material can be formed following a formation of a PMOS gate material, and vice versa.

Figure 4:
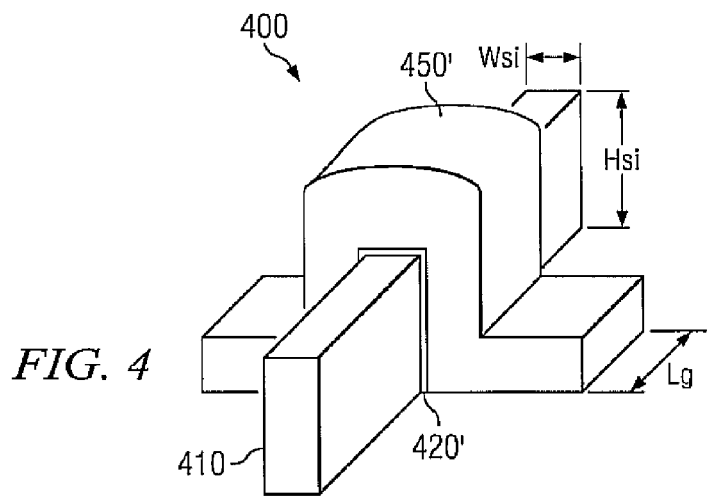
FIG. 4 depicts an exemplary MuGFET PMOS device formed upon an oxide insulator of a SOI substrate in accordance with the present teachings.

FIG. 1, FIGS. 2A-2F and FIG. 4 depict methods and structures for various exemplary dual work function gated devices having transistor metal gates that possess differing work function values. Specifically, FIG. 1 depicts an exemplary method 100 for fabricating a dual work function gated transistor device in accordance with the present teachings. In addition, generally according to the method 100 as described in FIG. 1, an exemplary dual work function gated semiconductor device 200 can be processed as shown in FIGS. 2A-2F. Although the processes and the structures shown in FIGS. 2A-2F are for planar devices such as a MOSFET device in bulk Si or a planar FET device in SOI, one of ordinary skill in the art will understand that these are exemplary and that other embodiments are envisioned. For example, FIG. 4 shows an exemplary three-dimensional MuGFET PMOS device 400 having a gate electrode with controlled work function formed upon the dielectric (i.e., oxide insulator) of a SOI substrate.

Referring to FIG. 1, in the method 100, an exemplary transistor device can be fabricated to have a gate dielectric formed on a silicon substrate (e.g., for a planar bulk MOSFET device) or a SOI substrate (e.g., for a planar FET device or a MuGFET device). The exemplary gate dielectric can include a PMOS associated surface and an NMOS associated surface.

At 110, a first-metal-containing material, for example, an Al-containing material, can be formed on one of the PMOS associated surface and the NMOS associated surface of the gate dielectric. In an exemplary embodiment, the first-metal-containing material can be formed on a PMOS associated surface of the gate dielectric. The first-metal-containing (e.g., Al-containing) material can be formed by first depositing a first-metal-containing layer on each surface of the PMOS and NMOS associated surfaces of the gate dielectric and then removing a portion of the first-metal-containing layer from the NMOS associated surface of the gate dielectric. The deposition and removal (e.g., patterning and etching) processes of the first-metal-containing layer can be performed using techniques known to one of ordinary skill in the art. In this manner, the fabricated device can have the first-metal-containing material formed on the exemplary PMOS associated surface of the gate dielectric and the exemplary NMOS associated surface of the gate dielectric can be exposed. In various embodiments, the first-metal-containing material can be an Al-containing material including, but not limited to, $Al_2O_3$, AlN or any other Al-containing material.

At 120, a second-metal-containing material can be deposited on each surface of the first-metal-containing material and the NMOS associated surface of the gate dielectric. The fabricated transistor device can therefore have stacked two layers, i.e., a first portion of the second-metal-containing material disposed on the first-metal-containing material (e.g., Al-containing), formed on the PMOS associated surface of the gate dielectric. A second portion of the second-metal-containing material can be on the NMOS associated surface of the gate dielectric. The second portion of the second-metal-containing material can later be used as, for example, an NMOS gate material. In various embodiments, the second-metal-containing material can be a single metal or a metal nitride chosen from one or more of, for example, Ti, Ta, Mo, Hf, Zr, TiN, TaN, WN, MoN, HfN, or ZrN.

At 130, a PMOS gate material can be formed by a reaction between the stacked two layers on the PMOS associated surface of the gate dielectric. The reaction can be initiated by, for example, a thermal treatment such as an annealing process, to form, for example, a metal alloy, which can be used as the PMOS gate material.

At 140, a PMOS gate electrode and an NMOS gate electrode can be formed by patterning and etching the PMOS and NMOS gate material and the underlying gate dielectric using techniques known to one of ordinary skill in the art. Other suitable structures can also be formed to complete the formation of the exemplary transistor device. For example, sidewall spacers can be formed along the sidewalls of the gate electrodes and the gate dielectrics, and suitable dopants can be introduced to form source/drain regions of the transistor device.

FIGS. 2A-2F depict cross-sectional views of an exemplary dual work function gated transistor device 200 at various stages of fabrication according to the exemplary method described in FIG. 1 in accordance with the present teachings. It should be readily apparent to one of ordinary skill in the art that the transistor device 200 depicted in FIGS. 2A-2F represents a generalized schematic illustration and that other regions/layers/species can be added or existing regions/layers/species can be removed or modified.

Figure 2A:
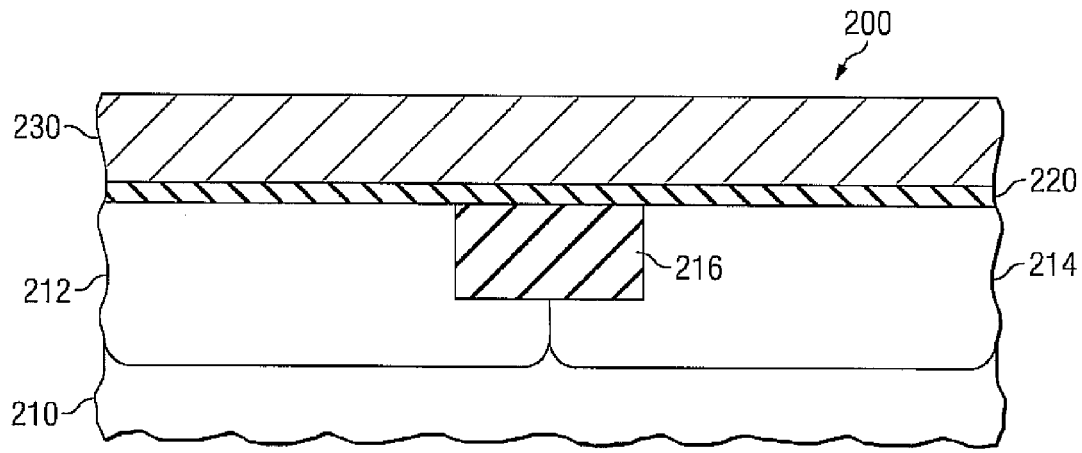
FIGS. 2A-2F depict cross-sectional views of an exemplary dual work function metal gated transistor device at various stages of fabrication in accordance with the present teachings.

In FIG. 2A, the device 200 can include a substrate 210, a dielectric material 220 and an Al-containing layer 230. The Al-containing layer 230 can be disposed on the dielectric material 220, which can be disposed over the substrate 210.

The substrate 210 can be a semiconductor material commonly used in the semiconductor manufacturing industry. For example, the substrate 210 can be a bulk substrate such as a silicon wafer that can be conductively doped to form a PMOS region 212 and an NMOS region 214 with an isolation region 216 separating the doped regions 212 and 214. The isolation region 216 can be a known shallow trench isolation (STI) region.

In an exemplary embodiment, the substrate 210 can be a silicon-on-insulator (SOI) wafer used for, e.g., planar or 3-D FET devices. In this case, a PMOS FET and an NMOS FET can be separated by an isolation structure such as a STI (not shown) formed on the buried oxide (not shown) of the SOI wafer.

The dielectric material 220 can be formed upon the substrate 210. The dielectric material 220 can be formed of any dielectric material as described above. The dielectric material 220 can be used as a gate dielectric for the transistor device 200.

The Al-containing layer 230 can be formed on the dielectric material 220 and can be formed of any material that contains metal Al, for example, $Al_2O_3$, AlN or any other Al-containing materials. One of ordinary skill in the art will understand that other desired metal-containing materials can also be used.

Figure 2B:
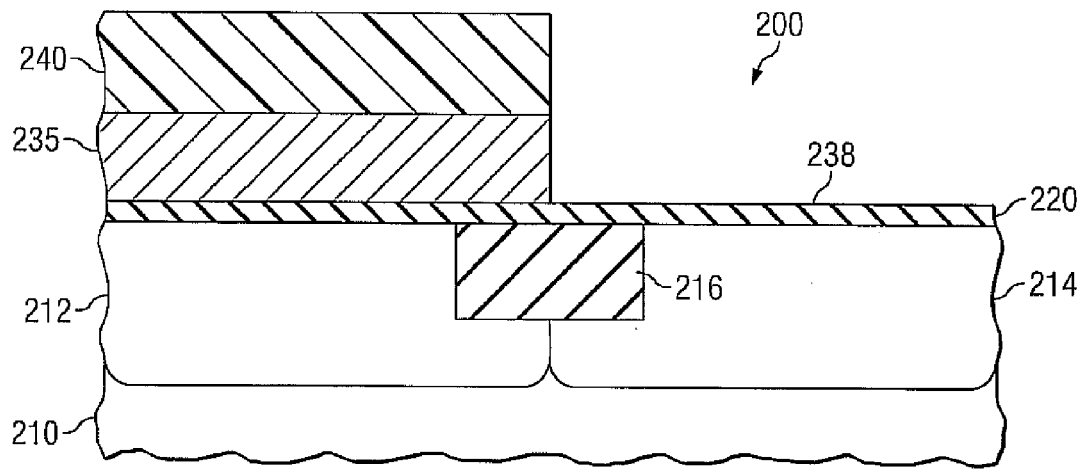

In FIG. 2B, an Al-containing material 235 can be formed on a selected surface of the dielectric material 220, for example, which can be over the PMOS region 212. The Al-containing material 235 can be formed by patterning and etching the Al-containing layer 230 (see FIG. 2A) using a mask pattern 240, such as a photoresist pattern, to remove a portion of the Al-containing layer 230 and expose a second selected surface 238 of the underlying dielectric material 220. The exposed second selected surface 238 of the dielectric material 220 can be over the NMOS region 214. Various suitable patterning and etching processes can be used and known to one of ordinary skill in the art. For example, the Al-containing layer 230 can be an AlN layer and can be etched by a selective reactive ion etching or a selective wet etching process such as using a KOH-based solution.

After the formation of the Al-containing material 235, the mask pattern 240 can be removed from the formed Al-containing material 235. In various embodiments, the Al-containing material 235 can have the same thickness as to that of the Al-containing layer 230. For example, the Al-containing material 235 can have a thickness ranging from about 10 angstrom to about 100 angstrom.

Figure 2C:
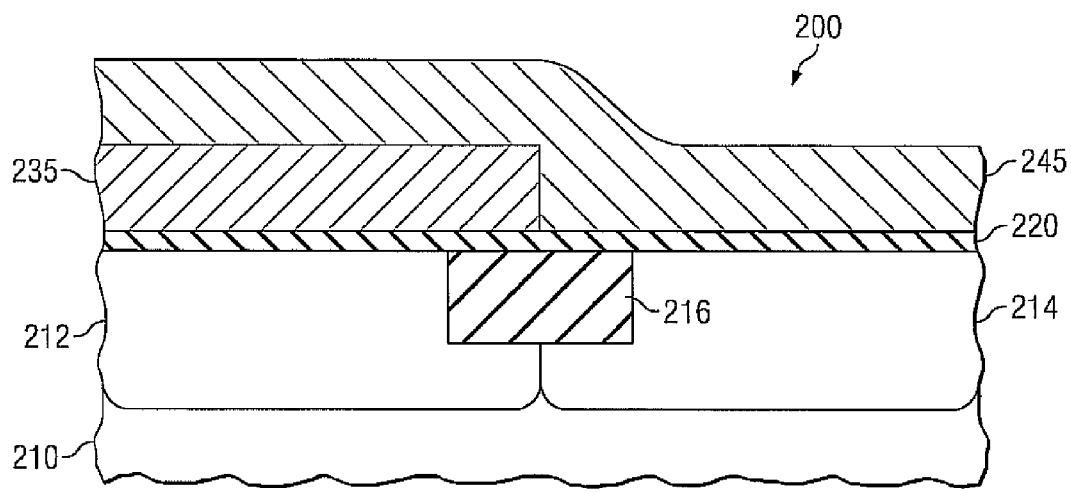

In FIG. 2C, a metal layer 245 can be deposited on the surface of the device 200, i.e., on each surface of the Al-containing material 235 and the exposed second selected surface 238 of the dielectric layer 220. The metal layer 245 can include various metal-containing materials, such as, for example, single metals, metal compounds, metal alloys, metal nitrides, metal silicides, metal oxide and all possible combinations thereof. For example, the metal layer 245 can include one or more materials selected from the group consisting of Ti, Ta, Mo, W, Zr, Hf, TiN, TaN, MoN, WN, ZrN, and HfN. The metal layer 245 can be deposited using various techniques. For example, a TaN layer can be deposited using such as atomic layer deposition (ALD), chemical vapor deposition (CVD) and/or sputtering techniques. In various embodiments, a portion of the deposited metal 245 can be used as a metal gate electrode, for example, an NMOS gate electrode for the transistor device 200.

Figure 2D:
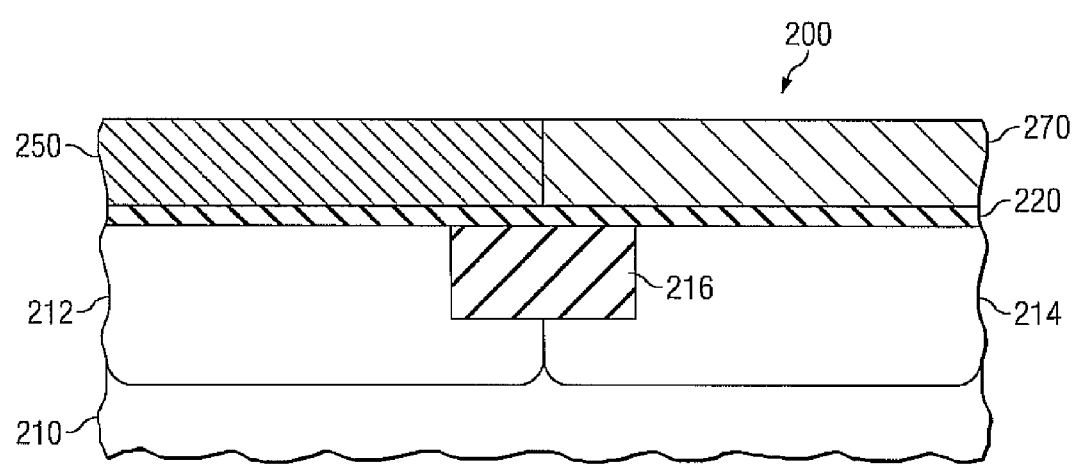

In FIG. 2D, a PMOS gate material 250 and an NMOS gate material 270 can be formed on the dielectric material 220. Specifically, a thermal treatment, for example, an annealing process, can be used for the device 200 such that areas having the layer stack of the Al-containing material 235 and a first (i.e., overlaying) portion of the metal layer 245 (see FIG. 2C) can undergo chemical reactions and form the PMOS gate material 250. The annealing process can be performed, for example, at elevated temperature ranging from about 500 to about 1000 degrees Celsius and with a pressure ranging from about 1 to about 760 torr. In an exemplary embodiment, the annealing process can be conducted at a temperature of about 1000 degrees Celsius and a pressure of about 1 torr to chemically combine the Al-containing material 235 and the overlaid first portions of the metal layer 245 to form the PMOS gate material 250.

The formed PMOS gate material 250 can therefore be a reaction product from the materials used for the Al-containing material 235 and the first portion of the metal layer 245 (see FIG. 2C). For example, the PMOS gate material 250 can be a TaAlN gate material, when the stack layer includes a TaN disposed on an AlN and/or on an $Al_2O_3$ layer. In another example, the PMOS gate material 250 can be a TiAlN gate material, when the stack layer includes a TiN disposed on an AlN and/or on an $Al_2O_3$ layer. In various embodiments, the formation of the PMOS gate material 250 can be controlled by the thickness and the composition of the metal layer 245 (see FIG. 2C). For example, the metal layer 245 such as a TaN or TiN layer can have a thickness of about 2 to about 20 nm. In various embodiments, the thickness ratio of the metal layer 245 and the Al-containing material 235 can impact the resulting metal gate work function composition and work function.

Figure 3:
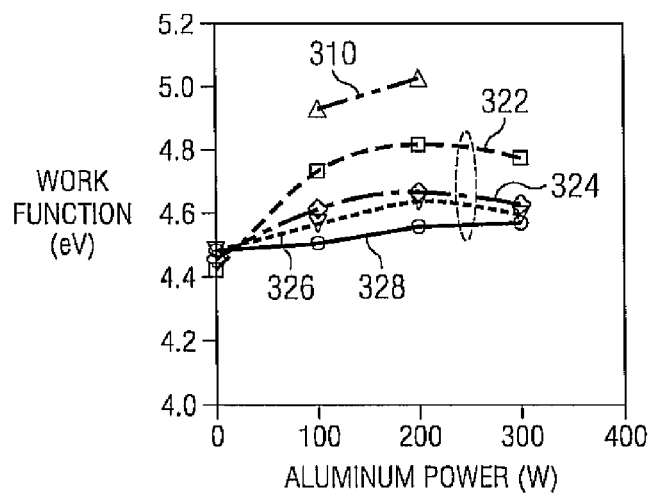
FIG. 3 depicts exemplary results showing the tunability of a TaAlN metal gate work function value in accordance with the present teachings.

In various embodiments, the PMOS gate material 250, such as a TaAlN or TiAlN metal gate, can have a composition modulated work function, for example, ranging from about 4.35 eV to about 5.0 eV. FIG. 3 depicts exemplary results showing the tunability of a TaAlN gate work function over a wide range of the power of Al composition in accordance with the present teachings. As shown, FIG. 3 includes curves 310, 322, 324, 326 and 328 showing the work function value of the exemplary TaAlN metal gate as a function of the aluminum power at various gas flow rates and using various gate dielectrics. Specifically, the curve 310 shows the work function value of the exemplary TaAlN gate material can range from about 4.9 eV to about 5.0 eV when the gas flow rate is about 5 sccm within a certain range of the Al-power. The curves 322, 324, 326, and 328 show the work function value of the exemplary TaAlN gate material can range from about 4.35 eV to about 4.9 eV at a gas flow rate of about 10 sccm and using various gate dielectrics, such as, for example, $SiO_2$, 60% $SiO_2$, 20% $SiO_2$ and $HfO_2$, respectively.

Referring back to FIG. 2D, the NMOS gate material 270 can be a second selected portion of the metal layer 245 (see FIG. 2C), which can be over the NMOS region 214 of the device 200. The NMOS gate material 270 can therefore be a metal nitride material such as TaN or TiN having a work function value, for example, ranging from about 4.1 eV to about 4.3 eV. In various embodiments, a planarization process such as CMP (chemical mechanical polishing) can be performed after the formation of the PMOS gate material 250 and the NMOS gate material 270, i.e., after the exemplary annealing process, to provide a polished surface of the device 200.

In various embodiments, the PMOS gate material 250 and the NMOS gate material 270 can be used as a mid-gap film formed on the dielectric material 220. In this case, a conductive material (not shown) such as a heavily doped film, for example, a polysilicon, can then be formed over the mid-gap film to form composite gate materials. In addition, depending upon the specific metal used for these gate materials, a diffusion barrier material can be inserted between the heavily doped film and the gate materials to prevent any reaction therebetween.

Figure 2E:
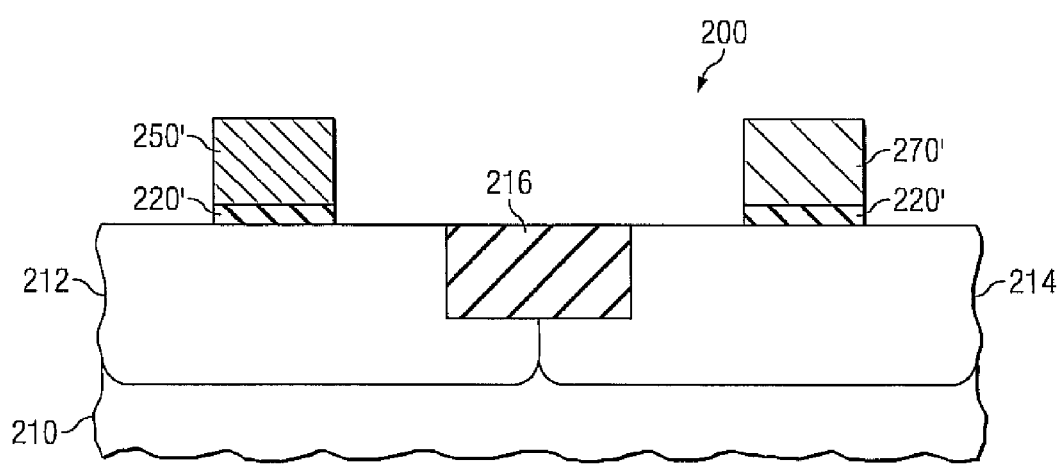

In FIG. 2E, using conventional methods, the PMOS gate material 250 along with the dielectric material 220 can be patterned to form a PMOS gate stack including a PMOS gate electrode 250' overlaid on a patterned portion of the dielectric material 220'. Likewise, the NMOS gate material 270 along with the dielectric material 220 can be patterned to form an NMOS gate stack including an NMOS gate electrode 270' overlaid on a patterned portion of the dielectric material 220'.

Figure 2F:
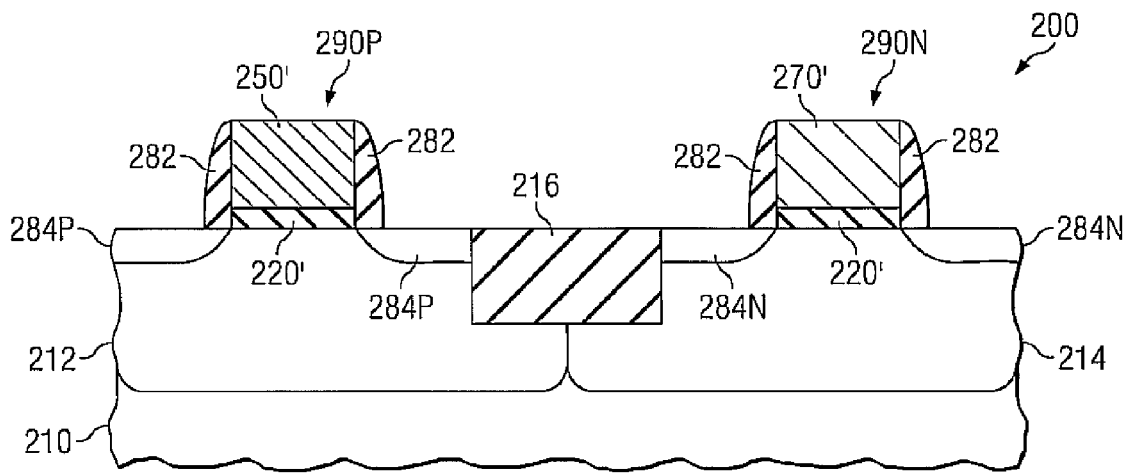

In FIG. 2F, completed PMOS and NMOS metal gate transistor structures 290P and 290N can be formed having transistor gates that possess differing work function values. Specifically, gate spacers 282 can be formed along the sidewalls of the PMOS and NMOS gate stacks. Respective source and drain regions 284P and 284N can then be formed in the silicon substrate 210. Even further, respective source and drain regions 284P and 284N can be formed in the doped PMOS region 212 and NMOS region 214 of the silicon substrate 210.

In various embodiments, the disclosed fabrication scheme shown in FIG. 1 and FIGS. 2A-2G can be used to create a three dimensional dual metal gate transistor. For example, a MuGFET device can be fabricated on a fully depleted SOI substrate, where the MuGFET device can include a PMOS gate electrode having a tunable work function value of, for example, about 4.8 eV or higher and an NMOS gate electrode having a tunable work function value of, for example, about 4.4 eV or lower.

FIG. 4 depicts an exemplary MuGFET PMOS device 400 formed upon the oxide insulator of a SOI substrate in accordance with the present teachings. It should be readily apparent to one of ordinary skill in the art that the transistor device 400 depicted in FIG. 4 represents a generalized schematic illustration and that other regions/layers/species can be added or existing regions/layers/species can be removed or modified.

The exemplary MuGFET PMOS device 400 shown in FIG. 4 can include a fin structure 410, a gate dielectric 420', and a gate electrode 450'. As shown, the gate electrode 450' can be formed on the gate dielectric 420' forming a gate stack with a gate length (Lg). This gate stack can be formed on and surrounding the fin structure 410. In various embodiments, the MuGFET PMOS device 400 can further include structures known to one of the ordinary skill in the art, such as, for example, gate spacers (not shown), and source and drain regions (not shown).

The fin structure 410 can be a thin silicon "fin" that forms the body of the device 400. Specifically, the fin structure 410 can be formed from a silicon block of a SOI substrate/wafer (not shown). For example, the SOI substrate can include a silicon substrate, an oxide insulator, and a silicon block. The silicon block can be an exposed silicon body etched from a thick silicon layer on the oxide insulator on the silicon substrate of the SOI. The fin structure 410 can be formed by patterning and etching the silicon block using methods and techniques that are known to one of ordinary skill in the art. As shown, the conducting channel of the resulting device 400 can be wrapped around the thin silicon "fin" 410 and the dimensions (i.e., Wsi as a width, and Hsi as a height) of the fin structure 410 can determine the effective channel length of the device 400.

The PMOS gate electrode 450' formed on the gate dielectric 420' can be fabricated using suitable patterning and etching techniques as similar to that described in FIGS. 2A-2F. The PMOS gate electrode 450', for example, a metal alloy such as TiAlN and/or TaAlN, can be formed using, for example, a heat treatment such as an annealing process as that similarly described in FIG. 1 and FIGS. 2A-2F. In an exemplary embodiment, the PMOS gate electrode 450' can be formed by patterning and etching a PMOS gate material (not shown), which can be formed by reacting stacked layers of, for example, a first-metal-containing material such as $Al_2O_3$ and/or AlN overlaid by a second-metal-containing material such as TiN and/or TaN. The PMOS gate electrode 450' can be a metal gate with various tunable work functions, for example, as those shown in FIG. 3. In an exemplary embodiment, the work function of the PMOS gate electrode 450' can be controlled at about 4.8 eV or higher, which can be a desired work function that is about 200 mV greater than the mid gap work function.

The gate dielectric 420' can be made of any dielectric material used for gate dielectric as disclosed herein. The gate dielectric 420' can be formed by suitable patterning and etching processes known to one of ordinary skill in the art.

In various embodiments, the gate spacers (not shown) can be formed along the sidewalls of the PMOS gate stack, i.e., the PMOS gate electrode 450' and the gate dielectric 420'. Following the formation of the gate spacer, the source and drain regions (not shown) can be formed by doping both ends of the silicon block of the SOI substrate. Various known dopants and suitable doping processes can be used to form the source and drain regions. In various embodiments, gate spacers (not shown) can also be formed along the sidewalls of the silicon block (not shown).

In various embodiments, a completed NMOS gate structures (not shown) can be formed including an NMOS metal gate electrode (not shown) to provide a second tunable work function value for the exemplary MuGFET transistor 400. For example, the NMOS gate electrode (not shown) can include a material of TaN and/or TiN having an exemplary work function of about 4.4 eV or lower, which is 200 mV less than that of the mid-gap work function.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming a transistor device comprising:
    forming a first-metal-containing material on a first selected surface of a gate dielectric, wherein the gate dielectric is disposed over a semiconductor substrate;
    depositing a second-metal-containing layer on each surface of the first-metal-containing material and a second selected surface of the gate dielectric; and
    forming a first gate material by reacting the first-metal-containing material with an overlaid portion of the second-metal-containing layer, wherein a second gate material is formed from a portion of the second-metal-containing layer on the second selected surface of the gate dielectric.

2. The method of claim 1, further comprising forming a first gate electrode and a second transistor gate electrode by patterning the first and the second gate materials.

3. The method of claim 1, further comprising a planarization process after the reaction between the first-metal-containing material and the overlaid portion of the second-metal-containing layer.

4. The method of claim 1, wherein forming a first gate material comprises an annealing process.

5. The method of claim 4, wherein the annealing process is performed at a temperature ranging from 500 to about 1000 degrees C. and a pressure ranging from about 1 Torr to about 760 Torr.

6. The method of claim 1, wherein the second-metal-containing material has a thickness of about 2 to about 20 nm.

7. The method of claim 1, wherein the semiconductor substrate comprises a silicon substrate and a SOI substrate.

8. The method of claim 1, wherein the first-metal-containing material comprises a material selected from the group consisting of $Al_2O_3$ and AlN.

9. The method of claim 1, wherein the second-metal-containing layer comprises a material selected from the group consisting of Ti, Ta, Mo, Hf, Zr, TiN, TaN, WN, MoN, HfN, and ZrN.

10. The method of claim 1, wherein each of the first and the second metal gate materials has a work function value of about 4.35 eV to about 5.0 eV.

11. A method of forming a transistor device, comprising:
    forming a gate dielectric over NMOS and PMOS regions separated by an isolation region of a semiconductor substrate;
    forming an Al-containing metal layer over the gate dielectric over the NMOS and PMOS regions;
    patterning and etching the Al-containing metal layer to remove the Al-containing metal layer from over the gate dielectric layer over the NMOS region, while leaving the Al-containing metal layer over the gate dielectric layer over the PMOS region;
    after patterning and etching the Al-containing metal layer, forming a TiN or TaN metal layer over the gate dielectric layer over the NMOS region and over the Al-containing metal layer over the gate dielectric layer over the PMOS region;
    after forming the TiN or TaN metal layer, performing a thermal anneal to chemically combine the Al in the Al-containing metal layer and the TiN or TaN in the TiN or TaN metal layer to form a TiAlN or TaAlN PMOS gate material over the PMOS region; with the TiN or TaN left as an NMOS gate material over the NMOS region.

12. The method of claim 11, wherein the Al-containing metal layer comprises an AlN layer.

13. The method of claim 12, wherein the deposited TiN or TaN metal layer has a thickness of about 2 to about 20 nm.

14. The method of claim 13, wherein the thermal anneal is conducted at a temperature of about 1,000 degrees C. and a pressure of about 1 torr.

15. The method of claim 14, further comprising performing a planarization process after formation of the PMOS gate material and NMOS gate material.

16. The method of claim 11, wherein the work function of the PMOS gate material is determined at least in part by a ratio of the thickness of the formed TiN or TaN metal layer to the thickness of the formed Al-containing metal layer.

17. The method of claim 16, wherein the work function of the PMOS gate material is within a range of from about 4.35 eV to about 4.9 eV.

18. The method of claim 17, wherein the work function of the NMOS gate material is within a range of from about 4.1 eV to about 4.3 eV.

* * * * *